United States Patent [19]

Okamoto et al.

[11] Patent Number: 5,698,372
[45] Date of Patent: Dec. 16, 1997

[54] PHOTOSENSITIVE LITHOGRAPHIC PRINTING PLATE

[75] Inventors: Yasuo Okamoto; Syunichi Kondo; Hiroyuki Nagase, all of Shizuoka, Japan

[73] Assignee: Fuji Photo Film Co., Ltd., Kanagawa, Japan

[21] Appl. No.: 711,073

[22] Filed: Sep. 9, 1996

Related U.S. Application Data

[63] Continuation of Ser. No. 510,773, Aug. 3, 1995, abandoned.

[30] Foreign Application Priority Data

Aug. 3, 1994 [JP] Japan ............... HEI 6-182539
Aug. 17, 1994 [JP] Japan ............... HEI 6-193357

[51] Int. Cl.$^6$ .................................................. G03F 7/033
[52] U.S. Cl. .................................. 430/285.1; 430/287.1; 522/149
[58] Field of Search ......................... 430/286.1, 287.1, 430/285.1; 522/149, 121

[56] References Cited

U.S. PATENT DOCUMENTS

| | | | |
|---|---|---|---|
| 3,929,489 | 12/1975 | Arcesi et al. | 430/285 |
| 4,177,074 | 12/1979 | Proskow | 430/286.1 |
| 4,195,997 | 4/1980 | Graham | 430/286.1 |
| 4,419,437 | 12/1983 | Noonan et al. | 430/338 X |
| 4,576,975 | 3/1986 | Reilly, Jr. | 430/287 X |
| 5,011,762 | 4/1991 | Lee et al. | 430/287 X |
| 5,250,385 | 10/1993 | Kondo et al. | 430/287 X |

FOREIGN PATENT DOCUMENTS 6-95372  4/1994  Japan ............... G03F 7/004

OTHER PUBLICATIONS

Grant etal, *Grant & Hackh's Chemical Dictionary*, 5th ed., McGraw–Hill Book Co., New York, NY, 1987, pp. 192, 451.

*Primary Examiner*—Cynthia Hamilton
*Attorney, Agent, or Firm*—Sughrue, Mion, Zinn, Macpeak & Seas, PLLC

[57] ABSTRACT

A photosensitive lithographic printing plate is described, which comprises a photopolymerizable composition containing at least the following components (i) to (iii): (i) a polymerizable compound having an addition-polymerizable unsaturated bond, (ii) a photopolymerization initiator, and (iii) a pigment dispersion, wherein the pigment dispersion is dispersed in the presence of a polymer having an aliphatic double bond in a main chain or a side chain thereof.

2 Claims, No Drawings

PHOTOSENSITIVE LITHOGRAPHIC PRINTING PLATE

This is a Continuation of application Ser. No. 08/510,773 filed Aug. 3, 1995, now abandoned.

FIELD OF THE INVENTION

The present invention relates to a photosensitive lithographic printing plate comprising a photopolymerizable composition.

BACKGROUND OF THE INVENTION

In photosensitive lithographic plates, photosensitive layers preferably contain colorants to visualize images obtained after development. In photopolymerizable photosensitive layers, use of dyes as the colorants causes inactivation of photo initiating radicals, frequently resulting in reduced sensitivity. Pigments are therefore used as the colorants in many cases. It is preferred that the pigments are dispersed finely, homogeneously and stably in the photosensitive layers. JP-A-3-69949 (the term "JP-A" as used herein means an "unexamined published Japanese patent application") (corresponding to U.S. Pat. No. 5,118,590) discloses a photosensitive lithographic printing plate comprising a photopolymerizable composition in which pigment particles whose surfaces have previously been processed with a lipophilic substance are dispersed in a polymerizable compound. However, this photosensitive lithographic printing plate is insufficient in dispersion of the pigment in the polymerizable compound, and the pigment particles coagulate again after dispersion. Thus, it is technically difficult to homogeneously disperse the pigment, an inorganic material, in the polymerizable compound, an organic material, because of their poor compatibility.

For this reason, the pigment particles cannot be dispersed homogeneously and stably in the polymerizable compound, resulting in difficulty of visualization of images obtained after development, and in deterioration of suitability for plate inspection and resolution of the photosensitive lithographic printing plate.

SUMMARY OF THE INVENTION

It is therefore an object of the present invention to provide a photosensitive lithographic printing plate in which a pigment is dispersed finely, homogeneously and stably in a polymerizable compound, which has good suitability for plate inspection and good resolution.

The present inventors have discovered that use of a pigment dispersion in which pigment particles are dispersed in the presence of a polymer having an aliphatic double bond in a main chain or a side chain thereof can give good dispersion, thereby obtaining a photosensitive lithographic printing plate having good suitability for plate inspection and good resolution. Furthermore, use of the polymer can provide a composition having higher sensitivity than conventional compositions.

In other words, this and other objects of the present invention have been attained by a photosensitive lithographic printing plate comprising a photopolymerizable composition containing at least the following components (i) to (iii):

(i) a polymerizable compound having an addition-polymerizable unsaturated bond, (ii) a photopolymerization initiator, and (iii) a pigment dispersion, wherein the pigment dispersion is dispersed in the presence of a polymer having an aliphatic double bond in a main chain or a side chain thereof.

DETAILED DESCRIPTION OF THE INVENTION

Research of the present inventors revealed that the pigment particles were dispersed finely, homogeneously and stably in the polymerizable compound by dispersing the pigment particles in the presence of the polymer having an aliphatic double bond in a main chain or a side chain thereof, and then dispersing the dispersion in the polymerizable compound again. Actual observation of the dispersed pigment particles showed that the size of the pigment particles obtained by the method according to the present invention was significantly reduced. The pigment particles are therefore kept in the homogeneously dispersed state without coagulation or precipitation during storage of a photosensitive material. Such good dispersion of the pigment particles causes a photopolymerizable photo-sensitive layer stably colored with brilliant colors, makes it easy to visualize images obtained after development, and further improves the suitability for plate inspection and the resolution of the photosensitive lithographic printing plate.

Furthermore, the sensitivity of the photosensitive lithographic printing plate is unexpectedly improved. From this fact, the polymer having an aliphatic double bond in a main chain or a side chain is presumed to have also the function of increasing the polymerization degree of the photopolymerizable photosensitive layer. In addition, because this function is noticeable on surfaces of the pigment particles, the pigment particles are securely fixed to hardened portions. According to the present invention, therefore, in the aspect that unhardened portions are removed to form color images on the hardened portions, the pigment particles do not drop out of the hardened portions, resulting in formation of brilliant color images, and in good suitability for plate inspection and good resolution.

The present invention will be further described in detail below.

In the present invention, the polymers having aliphatic double bonds in main chains or side chains thereof are used as the pigment dispersing agents. The aliphatic double bonds include chain carbon-carbon double bonds (ethylenically unsaturated bonds) and cyclic non-aromatic carbon—carbon double bonds (limited to the side chains).

The polymers may be either homopolymers or copolymers. In the copolymers, main chains or side chains of partial repeating units are only required to have aliphatic double bonds. However, the ratio of the repeating units having aliphatic double bonds is preferably 20 mol % or more, more preferably 50 mol % or more, and most preferably 60 mol % or more. From the viewpoint of stability, the ratio is preferably 95 mol % or less. The aliphatic double bonds within this range can disperse the pigments, inorganic materials, homogeneously and stably, and further can improve the polymerization degree of the photopolymerizable photosensitive layers.

Examples of the repeating units having aliphatic double bonds in main chains thereof, the repeating units having chain aliphatic double bonds in side chains, and the repeating units having cyclic aliphatic double bonds in side chains are shown by the following formulae (I), (II) and (III), respectively:

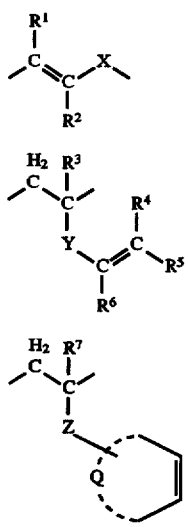

(I)

(II)

(III)

wherein $R^1$, $R^2$, $R^3$, $R^4$, $R^5$, $R^6$ and $R^7$ each independently represents a hydrogen atom, an alkyl group or an aryl group; X, Y and Z each independently represents a divalent connecting group; and Q represents an atomic group for forming an aliphatic ring.

Examples of the alkyl groups represented by $R^1$ to $R^7$ include an alkyl group preferably having from 1 to 20 carbon atoms, more preferably from 1 to 10 carbon atoms, and most preferably from 1 to 6 carbon atoms (for example, methyl, ethyl, propyl, butyl, hexyl, isopropyl).

Examples of the aryl groups represented by $R^1$ to $R^7$ include an aryl group having from 6 to 22 carbon atoms (for example, phenyl, naphthyl, anthryl).

The alkyl groups and the aryl groups may be substituted with one or more substituents such as an alkoxy group, an amido group and an alkoxycarbonyl group.

$R^1$, $R^2$, $R^3$, $R^4$, $R^5$, $R^6$ and $R^7$ are each preferably a hydrogen atom or an alkyl group, and more preferably a hydrogen atom or a methyl group.

Examples of the divalent connecting groups represented by X and Y include an alkylene group, an arylene group, a carbonyl group, an imino group, an oxygen atom, a sulfur atom and combinations thereof. The divalent connecting groups may be substituted with one or more substituents such as an aryl group, a halogen atom, a hydroxyl group and a cyano group.

Examples of the alkylene groups represented by X and Y include an alkylene group preferably having from 2 to 10 carbon atoms, more preferably from 2 to 6 carbon atoms, and most preferably 2 or 3 carbon atoms (for example, —CH$_2$CH$_2$CH$_2$—, —CH$_2$CH$_2$—, —CH$_2$CH(CH$_3$)—).

Examples of the arylene groups represented by X and Y include an arylene group having from 6 to 22 carbon atoms (for example,

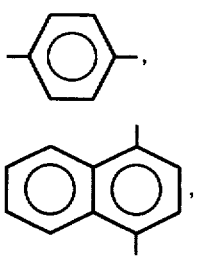

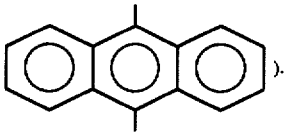

X is preferably an alkylene group.

Y is preferably an alkylene group, a carbonyl group, an oxygen atom or combinations thereof.

The aliphatic ring formed by Q is preferably an aliphatic ring having from 5 to 30 atoms which is formed in combination with a 5-membered or 6-membered ring(s) (for example, cyclohexane ring, norbornenyl ring, dicyclopentadiene ring). Examples of the aliphatic ring include bicyclic or tricyclic hydrocarbons having bridgehead carbons. It is preferred that the aliphatic ring has one carbon—carbon double bond. The aliphatic ring having two or more carbon—carbon double bonds shows a tendency to reduced reactivity due to conjugation.

Examples of the repeating units represented by formulae (I), (II) and (III) are shown below.

(I-1)

(I-2)

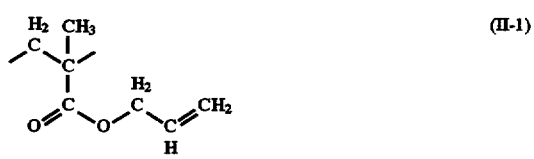
(II-1)

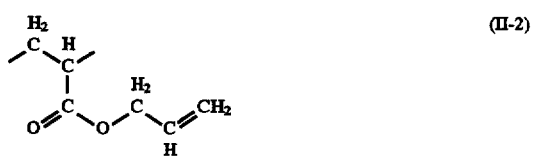
(II-2)

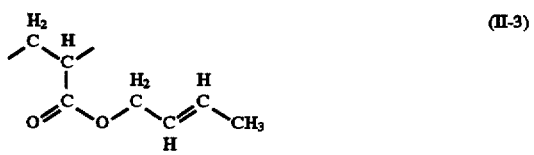
(II-3)

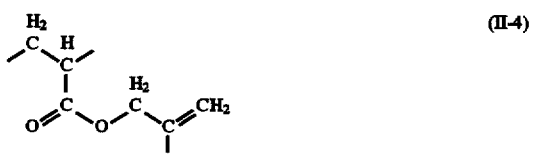
(II-4)

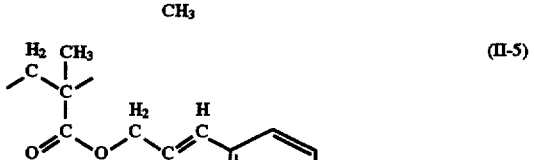
(II-5)

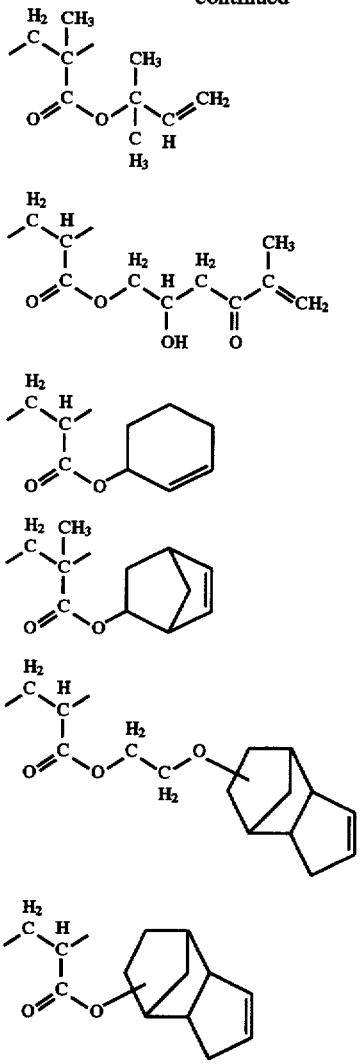

(II-6)

(II-7)

(III-1)

(III-2)

(III-3)

(III-4)

The polymers comprising the repeating units represented by the above-described formula (I) which have double bonds in main chains thereof are known as rubber materials including natural rubber. These polymers are described in *Polymer Reaction*, pages 7 to 40, edited by Kohbunshi Gakkai/published by Kyoritsu Shuppan (1978).

The polymers comprising the repeating units represented by the above-described formula (II) which have chain double bonds in side chains thereof are described in JP-A-64-17047 (corresponding to U.S. Pat. No. 4,985,339).

The polymers comprising the repeating units represented by the above-described formula (III) which have cyclic double bonds in side chains thereof can be easily synthesized as is shown in the following synthesis example.

[Synthesis Example 1]

Synthesis of Copolymer Containing Repeating Unit (III-2):

Methacrylate (36 g) obtained by condensation of 5-norbornene-2-ol and methacrylic acid chloride and 4 g of methacrylic acid were dissolved in 360 g of methyl ethyl ketone, and the solution was heated at 70° C. Then, 0.40 g of 2,2-azobis(2,4-dimethylvaleronitrile) was added thereto, followed by heating reaction for 8 hours. After cooled to room temperature, the resulting reaction solution was slowly added dropwise to 10 liters of water, and precipitated crystals were filtered, washed and dried, thereby obtaining 18.72 g (yield: 46.8%) of a copolymer having an average molecular weight of 56,000 which is composed of 83.3 mol % of repeating unit (III-2) and 16.7 mol % of methacrylic acid.

When the polymers used in the present invention are copolymers, they contain repeating units of saturated hydrocarbons, as well as the above-described repeating units having aliphatic double bonds. The repeating units of saturated hydrocarbons are preferably derived from ethylenically unsaturated compounds. Examples of the ethylenically unsaturated compounds include vinyl, allyl, acrylic acid, methacrylic acid, acrylate, methacrylate, acrylic acid amide and methacrylic acid amide.

The repeating units of saturated hydrocarbons may each be substituted with one or more substituents such as an aryl group, a halogen atom, a hydroxyl group and a cyano group.

When the polymers used in the present invention are copolymers, the molar ratio of the above-described repeating units having aliphatic double bonds to the repeating units of saturated hydrocarbons is from 0/100 to 100/0.

The molecular weight of the polymers used in the present invention is preferably from 1,000 to 1,000,000, and more preferably from 5,000 to 300,000. The amount of the polymers used is preferably from 1 to 1,000 parts by weight, more preferably from 10 to 500 parts by weight, and most preferably from 20 to 300 parts by weight, based on the weight of the pigments. This range is preferred in terms of dispersibility.

In the present invention, the pigment particles are dispersed in the presence of the above-described polymer having the aliphatic double bond in its main chain or side chain. This dispersion is preferably conducted in an appropriate solvent. As the solvent, a relatively lipophilic organic solvent is preferably used. Examples of the organic solvents include cyclohexanone, ethers (for example, propylene glycol monomethyl ether, THF, diglyme), ketones (for example, methyl ethyl ketone, 2-heptanone, 2,4-pentanedione), anisole, acetophenone, benzyl alcohol and methoxypropyl acetate. These solvents may be used as a combination of two or more of them.

The amount of the solvent used is preferably from 0.1 to 50 parts by weight, more preferably from 0.5 to 20 parts by weight, and most preferably from 2 to 10 parts by weight, based on the weight of the solid contents. This range is preferred in terms of dispersibility.

The pigments available in the present invention include known pigments described in various literatures, as well as commercial pigments. Such literatures are *Color Index C.I. Hand-Book, Latest Hand-Book of Pigments*, edited by Nippon Ganryo Gijutsu Kyokai (1977), *Latest Pigment Application Techniques*, CMC Shuppan (1986) and *Printing Ink Techniques*, CMC Shuppan (1984).

The pigments include black pigments, yellow pigments, orange pigments, brown pigments, red pigments, purple pigments, blue pigments, green pigments, fluorescent pigments, metal powder pigments and polymer binding pigments. Specifically, they are insoluble azo pigments, azo lake pigments, condensed azo pigments, chelate azo pigments, phthalocyanine pigments, anthraquinone pigments, perylene and perinone pigments, thioindigo pigments, quinacridone pigments, dioxazine pigments, isoindolinone pigments, quinophthalone pigments, dyeing lake pigments, azine pigments, nitroso pigments, nitro pigments, natural pigments, fluorescent pigments and inorganic pigments.

In the present invention, preferred example of the pigments include insoluble azo pigments, azo lake pigments, phthalocyanine pigments and anthraquinone pigments.

The pigments for use in the present invention may be subjected to surface processing. The surface-processing methods possibly include methods of coating surfaces of pigment particles with resin or wax, methods of allowing surfactants to adhere to pigment particles, and methods of binding reactive materials (for example, silane coupling agents, epoxy compounds, polyisocyanates) to surfaces of pigment particles. The above-described surface-processing methods are described in *Properties and Applications of Metallic Soaps*, Saiwai Syoboh, *Printing Ink Techniques*, CMC Shuppan (1984) and *Latest Pigment Application Techniques*, CMC Shuppan (1986).

For the amount of the pigments used, the upper limit is established so as not to significantly disturb polymerization reaction in the photopolymerizable photosensitive layers (or hardenable layers). Specifically, the amount should be a minimum amount necessary to give a desired optical density. This amount varies depending on the light absorbing characteristic or the absorbance of the individual pigments. In general, the amount of the pigments used is preferably from 0.001 to 5 g/m$^2$, more preferably from 0.05 to 3 g/m$^2$, and most preferably from 0.1 to 2 g/m$^2$.

These pigments may be used as a combination of two or more of them.

When the pigment particles are dispersed, it is preferred to appropriately adjust the dispersing temperature. Higher dispersing temperature results in a tendency of the dispersed pigment particles to coagulate again, whereas lower dispersing temperatures result in inefficient dispersion. The dispersing temperature is preferably from −20° to 100° C., more preferably from 0° to 80° C., and most preferably from 10° to 70° C.

Techniques used in production of ink or toner can be applied to dispersion itself of the pigments. Various dispersing devices can therefore be utilized. Examples of the dispersing devices include ultrasonic dispersing devices, sand mills, attriters, pearl mills, super mills, ball mills, impellers, dispersers, KD mills, colloid mills, dynatrons, three-roll mills and pressurized mills. The details of the pigment-dispersing methods are described in *Latest Pigment Application Techniques*, CMC Shuppan (1986).

Finely dispersed pigment particles having an average particle size of from 0.01 to 10 μm (preferably from 0.05 to 1 μm) can be prepared by dispersing the pigment particles in the presence of the polymer having the aliphatic double bond in its main chain or side chain as described above. This pigment dispersion is added to the polymerizable compound, and the mixture is stirred, whereby the pigment can be dispersed finely, homogeneously and stably in the polymerizable compound.

The polymerizable compound having an addition polymerizable unsaturated bond for use in the present invention as the component (i) is selected from compounds having at least one, preferably two or more, terminal ethylenically unsaturated bond(s).

Examples thereof include a monomer, a prepolymer such as a dimer, a trimer or another oligomer, a mixture thereof or a copolymer thereof. Examples of the monomer and the copolymer thereof include esters of unsaturated carboxylic acids (for example, acrylic acid, methacrylic acid, itaconic acid, crotonic acid, isocrotonic acid, maleic acid) with aliphatic polyhydric alcohols, and amides of unsaturated carboxylic acids with aliphatic polyhydric amines.

Examples of the esters of the aliphatic polyhydric alcohols with the unsaturated carboxylic acids as monomers include acrylates (for example, ethylene glycol diacrylate, triethylene glycol diacrylate, 1,3-butanediol diacrylate, tetramethylene glycol diacrylate, propylene glycol diacrylate, neopentyl glycol diacrylate, trimethylolpropane triacrylate, trimethylol propane tri(acryloyloxypropyl) ether trimethylolethane triacrylate, hexane diol diacrylate, 1,4-cyclohexanediol diacrylate, tetraethylene glycol diacrylate, pentaerythritol diacrylate, pentaerythritol triacrylate, pentaerythritol tetraacrylate, dipentaerythritol diacrylate, dipentaerythritol hexaacrylate, sorbitol triacrylate, sorbitol tetraacrylate, sorbitol pentaacrylate, sorbitol hexaacrylate, tri(acrylonyloxyethyl) isocyanurate, polyester acrylate oligomers); methacrylates (for example, tetramethylene glycol dimethacrylate, triethylene glycol dimethacrylate, neopentyl glycol dimethacrylate, trimethylolpropane trimethacrylate, trimethylolethane trimethacrylate, ethylene glycol dimethacrylate, 1,3-butanediol dimethacrylate, hexanediol dimethacrylate, pentaerythritoldimethacrylate, pentaerythritol trimethacrylate, pentaerythritol tetramethacrylate, dipentaerythritol dimethacrylate, dipentaerythritol hexamethacrylate, sorbitol trimethacrylate, sorbitol tetramethacrylate, bis[p-(3-methacryloxy-2-hydroxypropoxy)phenyl]dimethylmethane, bis[p-(acryloxyethoxy)phenyl]dimethylmethane); itaconates (e.g., ethylene glycol diitaconate, propylene glycol diitaconate, 1,3-butanediol diitaconate, 1,4-butanediol diitaconate, tetramethylene glycol diitaconate, pentaerythritol diitaconate, sorbitol tetraitaconate); crotonates (for example, ethylene glycol dicrotonate, tetramethylene glycol dicrotonate, pentaerythritol dicrotonate, sorbitol tetracrotonate); isocrotonates (for example, ethylene glycol diisocrotonate, pentaerythritol diisocrotonate, sorbitol tetraisocrotonate); and maleates (for example, ethylene glycol dimaleate, triethylene glycol dimaleate, pentaerythritol dimaleate, sorbitol tetramaleate). Furthermore, mixtures of the above-mentioned esters can be included therein.

Examples of the amides of the aliphatic polyhydric amines with the unsaturated carboxylic acids include methylenebis-acrylamide, methylenebis-methacrylamide, 1,6-hexamethylenebis-acrylamide, 1,6-hexamethylenebis-methacrylamide, diethylenetriaminetris-acrylamide, xylylenebis-acrylamide and xylylenebis-methacrylamide.

Other examples thereof include vinylurethane compounds containing two or more polymerizable vinyl groups in one molecule, in which a hydroxyl group-containing vinyl monomer shown in the following formula (A) is added to a polyisocyanate compound containing two or more isocyanate groups in one molecule described in JP-B-48-41708:

$$CH_2=C(R)COOCH_2CH(R')OH \qquad (A)$$

wherein R and R' each represents H or CH$_3$.

In addition, examples thereof include polyfunctional acrylates and methacrylates such as urethane acrylates as described in JP-A-51-37193, and polyester acrylates and epoxy-acrylates reacted epoxy resins with (meth)acrylic acid as described in JP-A-48-64183, JP-B-49-43191 (the term "JP-B" as used herein means an "examined Japanese patent publication") and JP-B-52-30490. Furthermore, photo-setting monomers and oligomers described in *Journal of Nippon Adhesive Association*, vol. 20, No. 7, pp. 300–308 (1984).

The component (i) in the present invention is used in an amount of from 5 to 90% by weight, preferably from 10 to 70% by weight, and more preferably from 15 to 50% by weight, based on the whole components of the photopolymerizable composition.

Examples of the photopolymerization initiator for use in the present invention as component (ii) include benzyl, benzoin, benzoin ether, Michler's ketone, anthraquinone, acridine, phenazine, benzophenone, 2-ethylanthraquinone, trihalomethyltriazine compounds; ketoxime esters; photoreductive dyes described in U.S. Pat. No. 2,850,445, such as Rose Bengale, Eosine and Erythrocin; and combinations of dyes and initiators, such as combinations of dyes and amines (JP-B-44-20189), combinations of hexaarylbiimidazoles, radical generating agents and dyes (JP-B-45-37377), combinations of hexaarylbiimidazoles and p-dialkylaminobenzylideneketones (JP-B-47-2528, JP-A-54-155292), combinations of dyes and organic peroxides (JP-B-62-1641, JP-A-59-1504, JP-A-59-140203, JP-A-59-189340, U.S. Pat. No. 4,766,055, JP-A-62-174203), combinations of dyes and active halogen compounds (JP-A-54-15102, JP-A-58-15503, JP-A-63-178105, JP-A-63-258903, JP-A-2-63054), and combinations of dyes and borate compounds (JP-A-62-143044, JP-A-62-150242, JP-A-64-13140, JP-A-64-13141, JP-A-64-13142, JP-A-64-13143, JP-A-64-13144, JP-A-64-17048, JP-A-64-72150, JP-A-1-229003, JP-A-1-298348, JP-A-1-138204, JP-A-2-179643, JP-A-2-244050).

Preferred examples of the dyes used in the combinations of dyes and active halogen compounds include dyes represented by the following formulae W-1 and W-2:

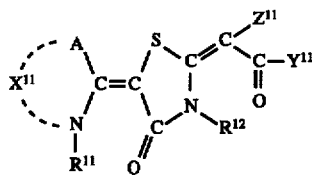

wherein $R^{11}$ and $R^{12}$ each independently represents a hydrogen atom, an alkyl group, a substituted alkyl group, an alkoxycarbonyl group, an aryl group, a substituted aryl group or an aralkyl group; A represents an oxygen atom, a sulfur atom, a selenium atom, a tellurium atom, an alkyl- or aryl-substituted nitrogen atom or a dialkyl-substituted carbon atom; $X^{11}$ represents a nonmetallic atomic group necessary for forming a nitrogen-containing five-membered heterocyclic ring; $Y^{11}$ represents a substituted phenyl group, an unsubstituted or substituted polynuclear aromatic ring or an unsubstituted or substituted heterocyclic aromatic ring; and $Z^{11}$ represents a hydrogen atom, an alkyl group, a substituted alkyl group, an aryl group, a substituted aryl group, an aralkyl group, an alkoxy group, an alkylthio group, an arylthio group, a substituted amino group, an acyl group or an alkoxycarbonyl group, which may be combined with $y^{11}$ to form a ring.

5-oxazolidinone ring, a 5-imidazolidinone ring or a 4-dithiolanone by a combination thereof; $L^1, L^2, L^3, L^4$ and $L^5$ each independently represents a methine group; m represents 1 or 2; i and h each represents 0 or 1; l represents 1 or 2; j and k each independently represents 1, 2 or 3; and X' represents a counter anion.

Examples of the nonmetallic atomic group formed by $X^{11}$ include thiazole, benzothiazole, naphthothiazole, benzoxazole, oxazole, naphthoxazole, thiazoline, oxathiazoline, benzoisoxazole, isoxazole, 2-pyridine, 4-pyridine, 4-quinoline, 2-quinoline, 1-isoquinoline, naphthylidine, tetrazole, imidazo[4,5-b]quinoxaline, 4,9-dioxo-4,9-dihydronaphtho[2,3-d]imidazole, naphthoimidazole and 3,3-dialkylindolenine, which each may be substituted. Examples of the nonmetallic atomic group formed by $Z^{21}$ and $Z^{22}$ include thiazole, oxazole, thiazoline, oxathiazoline, benzoisoxazole, isoxazole, 2-pyridine, 4-pyridine, 4-quinoline, 1-isoquinoline, naphthylidine, tetrazole, and imidazo[4,5-b]quinoxaline, which each may be substituted.

These photopolymerization initiators of component (ii) are usually contained in the compositions of the present invention at slight concentrations. Unsuitably high concentrations give unfavorable results such as interruption of effective light rays. The amount of component (ii) used in the present invention is preferably from 0.01 to 50%, more preferably from 0.1 to 30%, and most preferably from 0.5 to 20%, based on the addition-polymerizable compound of component (i). This range can provide good results.

It is preferred that the photopolymerizable compositions used in the present invention contain linear organic polymers as binders. As such "linear organic polymers", any linear organic polymers may be used as long as they have compatibility with photopolymerizable ethylenic unsaturated compounds. Water- or weak alkaline water-soluble or swellable linear organic polymers which make water development or weak alkaline water development possible are preferably selected. The linear organic polymers function as film forming agents for the compositions, and appropriately selected depending on the kind of developer to be used, namely whether a water developer, a weak alkaline water developer or an organic solvent developer. For example, use of a water-soluble organic polymer enables water development. Examples of the linear organic polymer include an addition polymer having a carboxylic acid group in its side chains, for example, methacrylic acid copolymers, acrylic acid copolymers, itaconic acid copolymers, crotonic acid copolymers, maleic acid copolymers, and partially esterified maleic acid copolymers, such as those described in JP-A-59-44615, JP-B-54-34327, JP-B-58-12577, JP-B-54-25957,

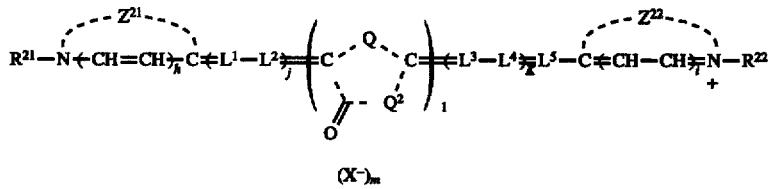

wherein $Z^{21}$ and $Z^{22}$ each independently represents a nonmetallic atomic group necessary for forming a nitrogen-containing five-membered and/or six-membered heterocyclic ring usually used in a cyanine dye; $R^{21}$ and $R^{22}$ each independently represents an alkyl group; $Q^1$ and $Q^2$ represent an atomic group necessary for forming a 4-thiazolidinone ring, a 5-thiazolidinone ring, a 4-imidazolidinone ring, a 4-oxazolidinone ring, a JP-A-54-92723, JP-A-59-53836 and JP-A-59-71048. Also, they include derivatives of acidic cellulose having a carboxylic acid in its side chains. In addition to those, also usable are adducts prepared by adding an acid anhydride to an addition polymer having a hydroxylic group. Of these, especially preferred are copolymers of benzyl (meth) acrylate/(meth)acrylic acid/(if needed, other addition polymerizable vinyl monomers), and copolymers of allyl (meth)

acrylate/(meth)acrylic acid/(if needed, other addition polymerizable vinyl monomers). Water-soluble linear organic polymers such as polyvinyl pyrrolidone and polyethylene oxide are also usable. In order to improve the mechanical strength of the cured film, an alcohol-soluble polyamide, or a polyether of 2,2-bis-(4-hydroxyphenyl) propane and epichlorohydrin may be used.

The content of the linear organic polymer in the composition of the present invention may be defined freely. However, if the content is more than 90% by weight, the binder has a bad influence on the composition in that the image intensity formed is thereby lowered. The content of the binder in the photopolymerizable composition of the present invention is preferably from 10 to 90% by weight, more preferably from 30 to 80%, per the total solid content in the composition. The ratio of the photopolymerizable ethylenically unsaturated compound to the linear organic polymer is preferably from 1/9 to 7/3, preferably from 3/7 to 5/5, by weight.

In addition to the fundamental components described above, a small amount of a thermal polymerization inhibitor is preferably added to the photosensitive composition according to the present invention to inhibit unnecessary thermal polymerization of the polymerizable compound having an addition-polymerizable unsaturated bond in preparation or preservation of the photopolymerizable composition. Examples of the thermal polymerization inhibitor include hydroquinone, p-methoxyphenol, di-t-butyl-p-cresol, pyrogallol, t-butyl catechol, benzoquinone, 4,4'-thiobis(3-methyl-6-t-butylphenol), 2,2'-methylenebis(4-methyl-6-t-butylphenol), primary cerium salt of N-nitrosophenylhydroxyamine, and aluminum salt of N-nitrosophenylhydroxyamine. The amount added of the thermal polymerization inhibitor is preferably from 0.001 to 10%, more preferably from 0.01 to 5%, and most preferably from 0.05 to 2%, by weight based on the total weight of the compositions. Further, in order to prevent polymerization inhibition caused by oxygen, a higher fatty acid derivative such as behenic acid or behenic acid amide may be added to localize it on a surface of the photosensitive layer during the course of drying after coating, as so desired. The amount of the higher fatty acid derivative added is preferably from 0.01 to 20%, more preferably 0.1 to 10%, and most preferably 0.5 to 5%, by weight based on the whole composition.

In addition, in order to improve the properties of the hardened film, an inorganic filler or other known additives may be added.

When the photopolymerizable compositions of the present invention are applied to supports, they are dissolved in various organic solvents to use them. Examples of the solvents used herein include acetone, methyl ethyl ketone, cyclohexane, ethyl acetate, ethylene dichloride, tetrahydrofuran, toluene, ethylene glycol monomethyl ether, ethylene glycol monoethyl ether, ethylene glycol dimethyl ether, propylene glycol monomethyl ether, propylene glycol monoethyl ether, acetyl-acetone, cyclohexanone, diacetone alcohol, ethylene glycol monomethyl ether acetate, ethylene glycol ethyl ether acetate, ethylene glycol monoisopropyl ether, ethylene glycol monobutyl ether acetate, 3-methoxypropanol, methoxymethoxyethanol, diethylene glycol monomethyl ether, diethylene glycol monoethyl ether, diethylene glycol dimethyl ether, diethylene glycol diethyl ether, propylene glycol monomethyl ether acetate, propylene glycol monoethyl ether acetate, 3-methoxypropyl acetate, N,N-dimethylformamide, dimethyl sulfoxide, γ-butyrolactone, methyl lactate and ethyl lactate. These solvents can be used alone or in combination. The solid concentration in the coating solutions is suitably from 1 to 50%, preferably from 3 to 40%, and more preferably from 5 to 20%, by weight.

The amount of the coating solutions applied preferably ranges from about 0.1 to about 10 $g/m^2$, more preferably from 0.3 to 5 $g/m^2$, and most preferably from 0.5 to 3 $g/m^2$, by weight after drying.

As the supports, dimensionally stable tabular materials are used. Such materials include paper, paper laminated with plastics (for example, polyethylene, polypropylene and poly-styrene), plates of metals (for example, aluminum (including aluminum alloys), zinc and copper), films of plastics (for example, cellulose diacetate, cellulose triacetate, cellulose propionate, cellulose butyrate, cellulose butyrate acetate, cellulose nitrate, polyethylene terephthalate, polyethylene, polystyrene, polypropylene, polycarbonate, polyvinyl acetal), and paper or plastic films laminated or deposited with the metals as described above. Of these supports, the aluminum plate is particularly preferred because of its high dimensional stability and low cost. Further, the composite sheet described in JP-B-48-18327 is also preferred in which an aluminum sheet is bonded to a polyethylene terephthalate film.

The supports having metal surfaces, particularly aluminum surfaces, are preferably subjected to surface processing such as graining processing, immersion processing in aqueous solutions of sodium silicate, potassium fluorozirconate or phosphates, or anode oxidation processing.

Further, the aluminum plate subjected to graining and thereafter subjected to immersion processing in the aqueous solution of sodium silicate is preferably used. As described in JP-B-47-5125, the aluminum plate subjected to anode oxidation processing and thereafter subjected to immersion processing in the aqueous solution of an alkali metal silicate is suitably used. The above-described anode oxidation processing is carried out by allowing the current to flow using the aluminum plate as an anode in an electrolytic solution composed of an aqueous solution or a nonaqueous solution of an inorganic acid (for example, phosphoric acid, chromic acid, sulfuric acid, boric acid), an organic acid (for example, oxalic acid, sulfamic acid), or a salt thereof, alone or as a combination of two or more kinds of them.

Further, silicate electrodeposition as described in U.S. Pat. No. 3,658,662 is also effective.

Furthermore, it is also useful to subject a support processed by electrolytic grain to combined surface processing of the above-described anode oxidation processing and sodium silicate processing as disclosed in JP-B-46-27481, JP-A-52-58602 and JP-A-52-30503.

In addition, it is also suitable to conduct mechanical roughening, chemical etching, electrolytic graining, anode oxidation processing and sodium silicate in this order as described in JP-A-56-28893.

Further, after the above processings, it is also suitable to undercoat the support with a water-soluble resin such as polyvinylphosphonic acid, a polymer or a copolymer having a sulfonic acid group in its side chain or polyacrylic acid, a water-soluble metal salt (for example, zinc borate), a yellow dye or an amine salt.

Such processing is conducted not only to make the surface of the support hydrophilic, but also to prevent harmful reaction of the photopolymerizable composition formed thereon and improve the adhesion of the photosensitive layer.

In order to prevent a polymerization inhibition action due to oxygen in the air, a protective layer formed of a polymer excellent in oxygen interruption such as polyvinyl alcohol having a saponification degree of 99% or more or acidic cellulose may be provided on the photopolymerizable composition layer formed on the support. Methods for forming such protective layers are described in detail in, for example, U.S. Pat. No. 3,458,311 and JP-B-55-49729.

The photosensitive materials using the photopolymerizable compositions of the present invention are exposed imagewise, and then unexposed portions of the photosensitive layers are removed with developers to obtain images. When the photopolymerizable compositions of the present invention are used for preparation of the lithographic printing plates, the developers preferably used include developers as described in JP-B-57-7427. Suitable examples thereof include aqueous solutions of inorganic alkali agents (for example, sodium silicate, potassium silicate, sodium hydroxide, potassium hydroxide, lithiumhydroxide, sodium tertiary phosphate, sodium secondary phosphate, ammonium tertiary phosphate, ammonium secondary phosphate, sodium metasilicate, sodium bicarbonate, aqueous ammonia), and aqueous solutions of organic alkali agents (for example, monoethanolamine, diethanolamine). They are added to give a final alkali concentration of from 0.1 to 10%, preferably from 0.5 to 5%.

Further, a small amount of a surfactant or an organic solvent such as benzyl alcohol, 2-phenoxyethanol or 2-butoxyethanol may be added to the alkaline aqueous solution as so desired. Examples thereof include compounds described in U.S. Pat. Nos. 3,375,171 and 3,615,480.

Furthermore, developers described in JP-A-50-26601, JP-A-58-54341, JP-B-56-39464 and JP-B-56-42860 are also excellent.

The photopolymerizable compositions of the present invention have high sensitivity to active light rays over the wide range from ultraviolet rays to visible rays. Accordingly, light sources which can be used include extra-high pressure, high pressure, medium pressure and low pressure mercury lamps, chemical lamps, carbon arc lamps, xenon lamps, metal halide lamps, various visible and ultraviolet laser lamps, fluorescent lamps, tungsten lamps and sunlight.

The present invention is now illustrated in greater detail by way of the following examples, but it should be understood that the present invention is not to be construed as being limited thereto.

EXAMPLES

Preparation of Pigment Dispersions

The mixed solutions of the compositions described in Table 1 were each dispersed in a Dynomill dispersing device at 3,000 rpm at 45° C. for 1 hour to obtain dispersions. The resulting dispersions were each diluted 10 times with the same solvent, and stored for 1 week, and then visually observed. The results showed that pigment dispersions (iii) -1 to (iii)-3 using the pigment dispersion polymers according to the present invention were small in average particle size and satisfactorily dispersed without coagulating sedimentation. In Table 1, "P.B." used as the pigment is Pigment Blue.

TABLE 1

| Pigment Dispersion | Pigment (g) | Dispersing Polymer (g) | Solvent (g) | Average Particle Size ($\mu$m) | Coagulating Sedimentation* |
|---|---|---|---|---|---|
| (iii)-1 | P.B.15:6(30) | Allyl methacrylate/ methacrylic acid copolymer (20) Copolymerization ratio: 83/17 Mw = 120,000 | Cyclohexanone (35) Methoxypropyl acetate (115) | 0.10 | Not observed |
| (iii)-2 | P.B.15:6(30) | Cinnamyl methacrylate/ methacrylic acid copolymer (20) Copolymerization ratio: 80/20 Mw = 100,000 | Cyclohexanone (35) Methoxypropyl acetate (115) | 0.11 | Not observed |
| (iii)-3 | P.B.15:6(30) | 2-n-Butenyl methacrylate/ methacrylic acid copolymer (20) Copolymerization ratio: 80/20 Mw = 100,000 | Cyclohexanone (35) Methoxypropyl acetate (115) | 0.11 | Not observed |
| Comparative Example | P.B.15:6(30) | Benzyl methacrylate/ methacrylic acid copolymer (20) Copolymerization ratio: 80/20 Mw = 100,000 | Cyclohexanone (35) Methoxypropyl acetate (115) | 0.15 | Observed |

*The dispersion was diluted 10 times with the same solvent, and allowed to stand for 1 week, followed by visual observation.

Preparation of Printing Plates

Surfaces of 0.30 mm-thick aluminum plates were grained by use of a nylon brush and an aqueous dispersion of 400 mesh pumice stone, and then thoroughly washed with water. The resulting plates were immersed in 10% sodium hydrochloride at 70° C. for 60 seconds to etch them, followed by washing with running water. Then, the plates were neutralized and washed with 20% nitric acid and subsequently washed with water. The plates were subjected to electrolytic roughening processing by use of the sinusoidal alternating waveform current in a 1% aqueous solution of nitric acid under the conditions of $V_A=12.7$ V at an anode quantity of electricity of 160 coulombs/dm$^2$. Measurement showed that their surface roughness was 0.6 $\mu$m (Ra indication). Subsequently, the plates were immersed in a 30% aqueous solution of sulfuric acid, and were subjected to desmutting processing at 55° C. for 2 minutes. Then, the plates were subjected to anode oxidation-processing in a 20% aqueous solution of sulfuric acid at a current density of 2 A/dm² for 2 minutes so as to give a thickness of an anode oxidation film of 2.7 g/m².

Each of the aluminum plates thus processed were coated with each of the following photopolymerizable compositions so as to give a dry amount applied of 1.4 g/m², and dried at 80° C. for 2 minutes to form a photosensitive layer.

Photopolymerizable Compositions

| | |
|---|---|
| Trimethylolpropanetri(acryloyloxypropyl) Ether | 2.0 g |
| Allyl Methacrylate/Methacrylic Acid Copolymer (copolymerization molar ratio: 80/20) | 2.0 g |
| Photopolymerization Initiator | shown in Table 2 |
| Pigment Dispersion Shown in Table 1 | shown in Table 2 |
| Fluorine Nonionic Surfactant | 0.03 g |
| Methyl Ethyl Ketone | 20 g |
| Propylene Glycol Monomethyl Ether Acetate | 20 g |

The photosensitive layer was coated with a 3 wt % aqueous solution of polyvinyl alcohol (saponification degree: 98–99%, polymerization degree: 550) so as to give a dry amount applied of 2 g/m², followed by drying at 100° C. for 2 minutes.

The photosensitivity was measured by use of a Fuji PS step guide (manufactured by Fuji Photo Film Co., Ltd., a step tablet in which the transmitted optical density is 0.05 at the first step, and increases in turn 0.15 at a time to the fifteenth step).

For Examples 1 to 5 and Comparative Example 1, the photosensitivity was indicated by the clear step number of the PS step guide when the sample was exposed for 80 seconds by use of a monochromatic light obtained through a Kenko optical filter BP-49 using a xenon lamp as a light source at an illuminance of 0.0132 mW/cm² at a photosensitive film surface portion. Further, for Example 6 and Comparative Example 2, the sample was exposed for 20 seconds from a distance of 1 m with a PS light, Type S, manufactured by Fuji Photo Film Co., Ltd. (a metal halide lamp, 2 kW) using a vacuum printing frame, and the photosensitivity was similarly indicated.

Development was conducted by immersing the sample in the following developing solution at 25° C. for 1 minute:

| | |
|---|---|
| 1 N Potassium Silicate | 30 g |
| Potassium Hydroxide | 15 g |
| $C_{12}H_{25}$-$C_6H_4$-$SO_3Na$ | 3 g |
| Water | 1000 g |

Results are shown in Table 2.

ΔD represents the difference between the image portion density (Dmax) and the non-image portion density (Dmin) of the reflection density measured with a Mackbeth densitometer (RD 920).

For the dot reproduction, the reproduction region of 200 lpi dots at the time when six steps of a gray scale were clear was visually observed.

The clear step number of the grey scale (G/S) was visually evaluated.

TABLE 2

| No. | Photopolymerization initiator | Pigment Dispersion | Light Source | G/S Clear Step Number | ΔD | 200 lpi dot reproduction |
|---|---|---|---|---|---|---|
| Example 1 | a-1 (0.15 g) b-1 (0.2 g) c-1 (0.4 g) | (iii)-1 of Table 1 (2 g) | xenon + BP-49 | 11 | 0.85 | 2–97% |
| Example 2 | a-1 (0.15 g) b-1 (0.2 g) c-1 (0.4 g) | (iii)-2 of Table 1 (2 g) | " | 11 | 0.84 | 2–97% |
| Example 3 | a-1 (0.15 g) b-1 (0.2 g) c-1 (0.4 g) | (iii)-3 of Table 1 (2 g) | " | 11 | 0.85 | 2–97% |
| Example 4 | a-2 (0.15 g) b-1 (0.2 g) c-1 (0.4 g) | (iii)-1 of Table 1 (2 g) | " | 11 | 0.85 | 2–97% |
| Example 5 | a-3 (0.15 g) b-2 (0.2 g) c-1 (0.4 g) | (iii)-1 of Table 1 (2 g) | " | 10 | 0.85 | 2–97% |
| Comparative Example 1 | a-1 (0.15 g) b-1 (0.2 g) c-1 (0.4 g) | dispersion of Comparative Example of Table 1 (2 g) | xenon + BP-49 | 8 | 0.82 | 3–97% |
| Example 6 | b-3 (0.1 g) | (iii)-1 of Table 1 (2 g) | metal halide | 13 | 0.85 | 2–97% |
| Comparative Example 2 | b-3 (0.1 g) | dispersion of Comparative Example of Table 1 (2 g) | metal halide | 10 | 0.72 | 3–97% |

The photopolymerization initiators used in Examples and Comparative Examples are shown below:

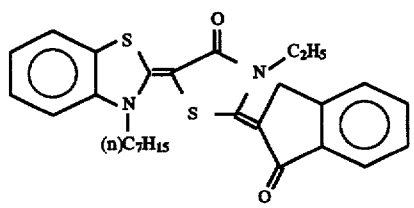

a-1

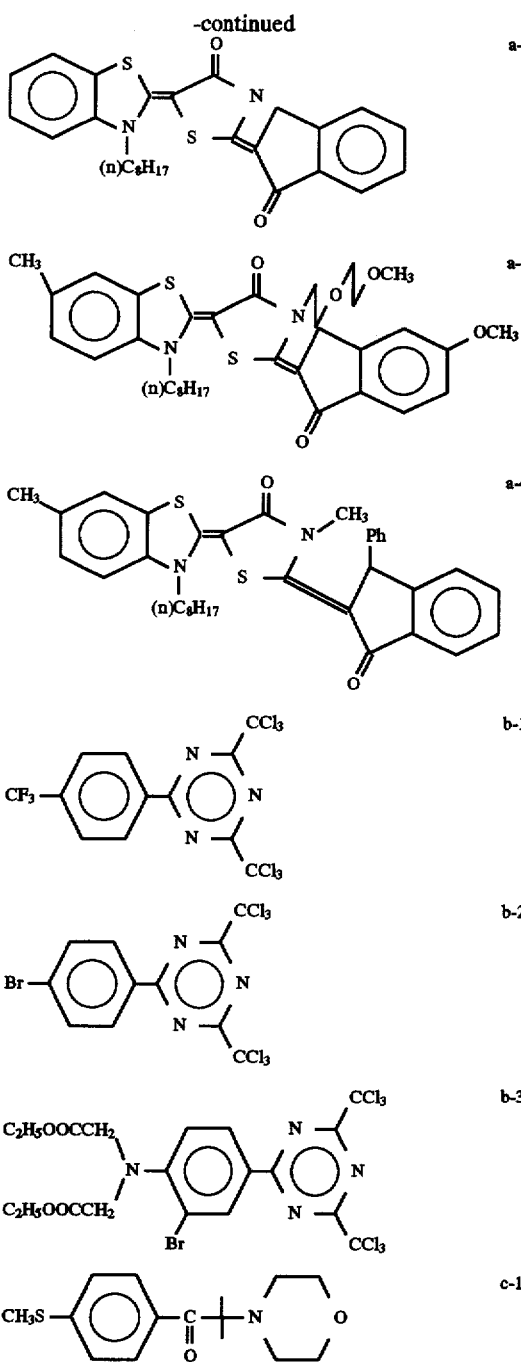

As is apparent from the results shown in Table 2, use of the pigment dispersions prepared by dispersing the pigment particles in the presence of the polymers having aliphatic double bonds in main chains or side chains thereof specifically results in high sensitivity and high image quality, and further results in good contrasts between the image portions and the non-image portions.

According to the present invention, the pigment particles are dispersed finely, homogeneously and stably in the polymerizable compounds, which can provide the photosensitive lithographic printing plates having good suitability for plate inspection and good resolution, and further having high sensitivity.

While the invention has been described in detail and with reference to specific embodiments thereof, it will be apparent to one skilled in the art that various changes and modifications can be made therein without departing from the spirit and scope thereof.

What is claimed is:

1. A photosensitive lithographic printing plate comprising a photo polymerizable composition comprising:

(i) a polymerizable compound having an addition-polymerizable unsaturated bond, (ii) a photopolymerizable initiator, and (iii) a pigment dispersion, wherein said photo polymerizable composition is prepared by dispersing pigment particles in the presence of a polymer having an aliphatic double bond in a side chain thereof and a repeating unit represented by formula (II-1) or (II-2) to form the pigment dispersion:

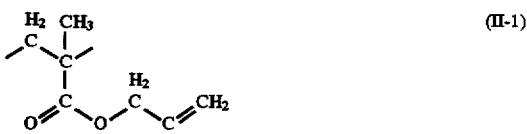

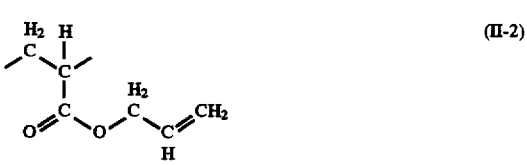

adding the pigment dispersion to the polymerizable compound, and stirring the resulting mixture, whereby the pigment is dispersed finely, homogeneously and stably in the polymerizable compound.

2. A photosensitive lithographic printing plate comprising a photopolymerizable composition comprising:

(i) a polymerizable compound having an addition-polymerizable unsaturated bond, (ii) a photopolymerizable initiator, and (iii) a pigment dispersion, wherein said photo polymerizable composition is prepared by dispersing pigment particles in the presence of a polymer having an aliphatic double bond in a side chain thereof and a repeating unit represented by formula (II-1) or (II-2) to form the pigment dispersion:

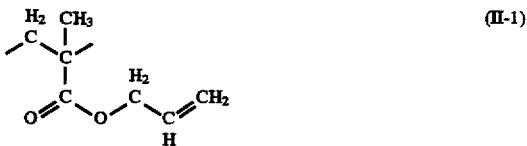

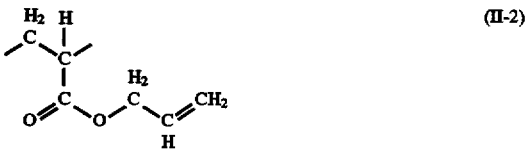

mixing the pigment dispersion, the photopolymerizable initiator and the polymerizable compound, and stirring the resulting mixture, whereby the pigment is dispersed finely, homogeneously and stably in the photopolymerizable composition.

* * * * *